United States Patent
Sijben

(10) Patent No.: US 7,940,511 B2
(45) Date of Patent: May 10, 2011

(54) ELECTROSTATIC CLAMP, LITHOGRAPHIC APPARATUS AND METHOD OF MANUFACTURING AN ELECTROSTATIC CLAMP

(75) Inventor: Anko Jozef Cornelus Sijben, Veghel (NL)

(73) Assignee: ASML Netherlands B.V., Veldhoven (NL)

( * ) Notice: Subject to any disclaimer, the term of this patent is extended or adjusted under 35 U.S.C. 154(b) by 657 days.

(21) Appl. No.: 11/902,501

(22) Filed: Sep. 21, 2007

(65) Prior Publication Data

US 2009/0079525 A1 Mar. 26, 2009

(51) Int. Cl.
*H02N 13/00* (2006.01)
(52) U.S. Cl. ....................................................... 361/234
(58) Field of Classification Search ................... 361/234
See application file for complete search history.

(56) References Cited

U.S. PATENT DOCUMENTS

| 4,502,094 A | 2/1985 | Lewin et al. .................. 361/234 |
| 2003/0233977 A1 | 12/2003 | Narendar et al. |
| 2005/0248746 A1* | 11/2005 | Zaal et al. ........................ 355/75 |
| 2007/0097346 A1* | 5/2007 | Zaal et al. ........................ 355/72 |
| 2007/0103666 A1 | 5/2007 | Ottens et al. |
| 2007/0116939 A1* | 5/2007 | Benitsch et al. ........... 428/292.1 |
| 2008/0024743 A1* | 1/2008 | Kruit et al. ...................... 355/30 |

FOREIGN PATENT DOCUMENTS

JP 2000340640 A * 12/2000

* cited by examiner

*Primary Examiner* — Ronald W Leja
(74) *Attorney, Agent, or Firm* — Pillsbury Winthrop Shaw Pittman LLP

(57) ABSTRACT

An electrostatic clamp for use in a lithographic apparatus includes a layer of material provided with burls, wherein an electrode surrounded by an insulator and or a dielectric material is provided in between the burls. The electrostatic clamp may be used to clamp an object to an object support in a lithographic apparatus.

21 Claims, 4 Drawing Sheets

ELECTROSTATIC CLAMP, LITHOGRAPHIC APPARATUS AND METHOD OF MANUFACTURING AN ELECTROSTATIC CLAMP

FIELD

The present invention relates to an electrostatic clamp for holding an object, a lithographic apparatus including such clamp and methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, e.g a mask (reticle), may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Electrostatic clamps may be used in lithographic apparatuses operating at certain wavelengths, e.g. EUV, since at these wavelengths, certain regions of the lithographic apparatus operates under vacuum conditions. An electrostatic clamp may be provided to electrostatically clamp an object, such as a mask or a substrate (wafer) to an object support, such as a mask table or a wafer table, respectively.

U.S. Pat. No. 4,502,094 (FIGS. 2 and 3) discloses a semiconductor wafer 1 located on an electrostatic chuck (clamp) 2 which includes a thermally conductive support 3, 5 made of for example aluminum. For positioning the wafer 1 on the chuck, locating pins 13a, 13b are provided so that the flat edge 1a of wafer 1 can abut pins 13a and the rounded edge 1b abuts pin 13b so that the location of the wafer 1 is uniquely defined. The support has a peripheral portion 3 which may be 6 mm thick and a thinner, perforated central portion 5 having a thickness of approximately 3.5 mm. The central portion has perforations or apertures 6 which are circular in cross section with a diameter of 3 mm. The electrostatic chuck 2 also includes thermally conductive portions in the form of copper pillars 7 which are secured in the apertures 6. The pillars 7, which are 6 mm long and have a diameter of 3 mm, are in thermal contact with the central portion of the support and also with the peripheral portion 3 which because of its relatively large size, can act as a heat sink.

The pillars 7 have flat end faces 8 which lie in the same fixed plane so that the semiconductor wafer 1 can bear on them as well as on the major surface 9 of the peripheral portion 3 of the support. In this way, the wafer can be supported in a fixed plane relative to the electrostatic chuck 2. Moreover, because the pillars 7 are made of metal they are electrically (as well as thermally) conductive so that the semiconductor wafer 1 is electrically contacted at its back surface (i.e. the surface facing the electrostatic chuck 2) by the pillars 7.

The chuck 2 also has an electrically conductive member in the form of a grid electrode 10 which may be made of, for example, aluminum. Essentially the grid 10 is circular, having a diameter of 90 mm and a thickness of 1.3 mm. The meshes of the grid 10 are constituted by circular apertures 11 which have a diameter of 5 mm. The grid 10 has parts which extend between the pillars 7 because it is located such that the pillars 7 extend through the apertures 11, but the pillars 7 and grid 10 are mutually insulated by a layer of dielectric material 12. The layer 12 of dielectric material which may be, for example, an epoxy resin surrounds the grid 10 so that, in addition to insulating the grid from the pillars 7 the grid 10 is also insulated from the central portion 5 of the support. The separation of the grid 10 from both the pillars 7 and the central portion 5 of support 2 is, for example, 1 mm, the dielectric layer 10 filling the whole space between these various members. In addition the dielectric layer is present on the upper surface of grid 10 but this part of layer 10 has a thickness of approximately 200 micrometers. As explained in more detail hereinafter, the pillars 7 may protrude from the dielectric layer 12 so that the semiconductor wafer 1 is spaced apart from layer 12 by approximately 10 micrometers.

To hold the semiconductor wafer 1 against the chuck 2 a potential difference is applied between the wafer 1 and the grid electrode 10. Typically this potential difference is 4 kV. Electrical contact is made to the back surface of wafer 1 via pillars 7 from the support 2 and a bias potential of, for example, approximately 4 kV is applied to grid 10 via an electrical connection 4 extending through the central portion 5 of the support and through the dielectric layer 12. Thus an electrostatic clamping force is established across the dielectric layer 12 so that the wafer 1 is held in a fixed plane against the pillars 7 of the chuck 2. The magnitude of the clamping force is proportional to the square of the potential difference between wafer 1 and electrode 10, directly proportional to the dielectric constant of layer 12, and inversely proportional to the square of the distance between the wafer 1 and the grid 10.

FIG. 3 is a plan view, taken from above, of the semiconductor wafer and the chuck of FIG. 2 the semiconductor wafer being partially cut away. FIG. 2 shows a cross section along the line I-I' of FIG. 3. As shown in FIG. 3, the chuck 2 has a symmetrical distribution of pillars 7. In order to hold the wafer evenly against the chuck, it is preferable that the pillars 7 are relatively closely spaced to avoid localized bowing of the wafer. This is also consistent with the need to avoid temperature variations across the wafer 1. The greater the number of pillars 7 and the closer is their spacing the more efficient can be the transfer of heat from the wafer to the thick peripheral heat sink 3 of the support. But, as far as the number of pillars is concerned, a compromise has to be reached because the contact pressure due to electrostatic attraction is reduced as the number of pillars 7 is increased. However, because the pillars 7 protrude from dielectric layer 12, the wafer 1 contacts the chuck 2 only at the end faces 8 of the pillars 7 and at the inner periphery of the major surface 9. By limiting the contact area in this way the contact pressure (i.e. force per unit area) is maximized. This is beneficial because the efficiency of heat transfer between the wafer 1 and the pillars 7 depends on the contact pressure.

The object which is clamped on the electrostatic clamp needs to positioned with a very high accuracy on the electrostatic clamp and the position of the object on the electrostatic clamp needs to be stable over time.

SUMMARY

It would be beneficial, for example, to provide an improved electrostatic clamp which gives a high accuracy and stability of the position of the object.

According to an aspect of the invention, there is provided an electrostatic clamp configured to, in use, hold an object in a fixed plane in a lithographic apparatus, the clamp including a support provided with burls whereby the top of the burls determine the plane in which the object is held and an electrode surrounded by an insulator is provided in between the burls, wherein the support is made from a low expansion material.

According to a further aspect of the invention there is provided a method of manufacturing an electrostatic clamp configured to electrostatically clamp an object to an object support in a lithographic apparatus, the method including: providing a layer of material with burls; and disposing an electrode surrounded by an insulator and or dielectric material in between the burls.

According to a further aspect of the invention there is provided a lithographic apparatus including: an object support constructed to support an object in a beam path of a radiation beam; an electrostatic clamp configured to electrostatically clamp the object against the object support; the clamp including a support provided with burls whereby the top of the burls determine the plane in which the object is held and an electrode surrounded by an insulator is provided in between the burls, wherein the support is made from low expansion material.

According to an aspect of the invention, there is provided a lithographic apparatus including an illumination system configured to condition a beam of radiation; a pattern support configured to hold a patterning device, the patterning device configured to pattern the beam of radiation to form a patterned beam if radiation; a substrate support configured to hold a substrate; a projection system configured to project the patterned beam of radiation onto the substrate; and an electrostatic clamp configured to electrostatically clamp the patterning device or the substrate on the respective support, the clamp including a table including a plurality of burls, the top of the burls determining a substantially planar surface on which the patterning device or the substrate is held; and an electrode encapsulated by an insulator and arranged in between the burls, wherein the table is made from low expansion material.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
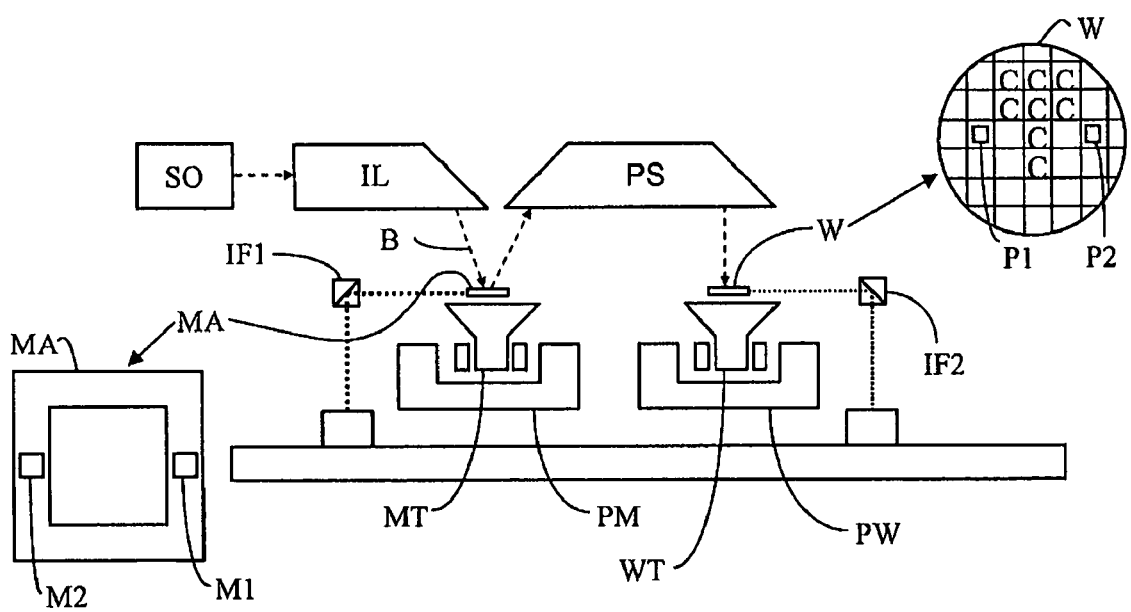
FIG. 1 depicts a lithographic apparatus in accordance with an embodiment of the invention.
Figure 2:
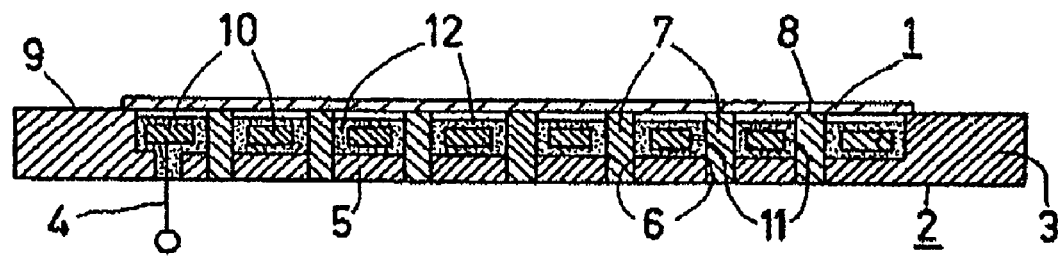
FIG. 2 is a cross-sectional view, taken on the line I-I' of FIG. 3, of a semiconductor wafer located on a conventional electrostatic chuck.
Figure 3:
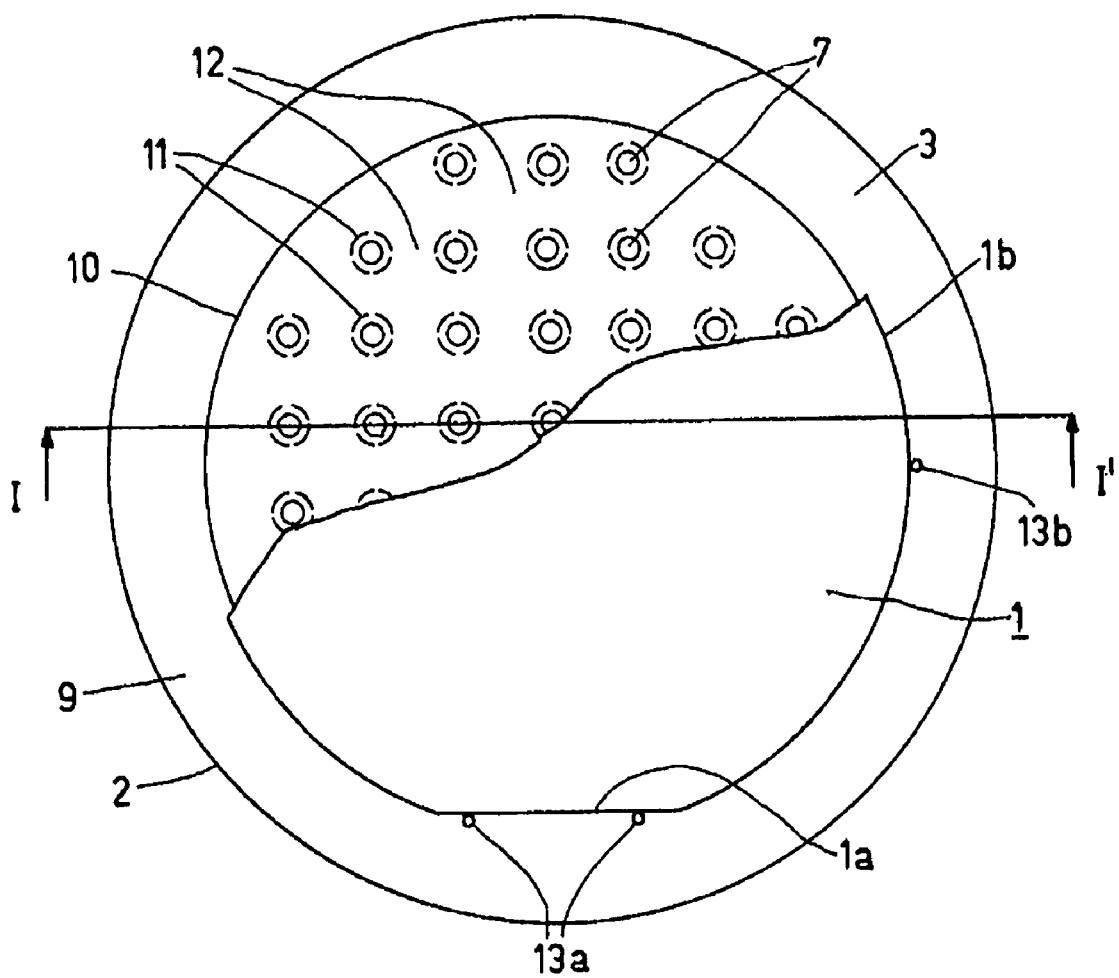
FIG. 3 is a plan view, taken from above, of the semiconductor wafer and the chuck of FIG. 2, the semiconductor wafer being partially cut away.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure or support or pattern support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The support structure and the substrate table may also be hereinafter referred to as an article support. An article includes but is not limited to a patterning device, such as a reticle, and a substrate, such as a wafer.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected by the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 4:
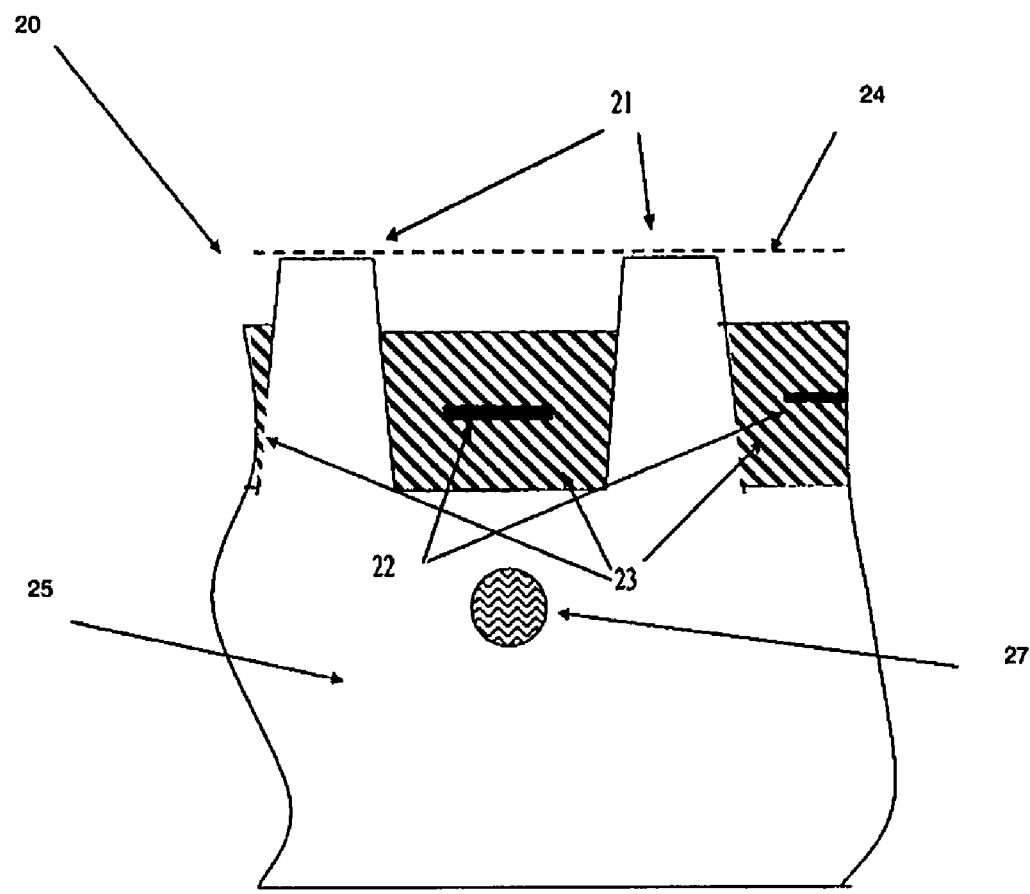
FIG. 4 depicts a partial cross section of the top layer of an electrostatic clamp according to an embodiment of the invention.

FIG. 4 depicts a partial cross section of the electrostatic clamp according to an embodiment of the invention. In the embodiment shown in FIG. 4, the electrostatic clamp 20 is configured to, in use, hold an object in a substantially fixed plane 24 and includes a support or table 25 provided with burls 21 whereby the top of the burls determine the plane 24 in which the object is held and an electrode 22 surrounded (e.g. encapsulated) by a dielectric 23 is provided in between the burls 21. The dielectric 23 functions also as an insulator. The substantially fixed plane (or substantially planar surface) may correspond to a plane in which the substrate is held during substrate exposure. The distance between the electrode 22 and the top of the burls 21 may be between 50 and 1000 μm. While only two burls 21 are shown in FIG. 4 it will be appreciated that in general multiple burls may be used and that the electrode 22 and the dielectric material 23 may be located in between each of those burls 21. In an embodiment, the support 25 provided with the burls 21 may be made form one material so that the position of the burls 21 on the support 25 is very stable and rigid which helps to keep the object stable on its position in the plane 24. To improve the stability, the support 25 may be a factor of 10 to 200 thicker than the height of the burls 21. For example the support may be about 40 mm thick with a height of the burl of about 300 μm.

The top of the burls 21 determine the plane 24 (or a substantially planar surface) in which the object is held. The top of the burls 21 may be in contact with the object and this contact may require the material of the burl 21 to be wear resistant since every time an object is clamped on the burls 21 forces are exerted on the burls 21 which may cause wear of the burls 21. Wear may make the burls 21 of the clamp 20 more sensitive to sticking effects. Sticking effects are generally due to adhesion forces between the bottom section of the object and the top section of the supporting burls 21, as well as to electrostatic forces generated by residual electrostatic charges. Adhesion forces may be generated by material impurities, and roughness imperfectness of the contacting surfaces. Objects may slip over the burls 21, thereby causing wear and roughness imperfection on the burls 21, which may lead to additional sticking. Another cause of wear may be the cleaning of the burls 21 that is desirable when contaminants stick to burls 21.

The object which is clamped on the electrostatic clamp 20 needs to positioned with a very high accuracy and the position of the object on the electrostatic clamp 20 needs to be stable over time. If copper and aluminum is used for the burls 21 and the support 25 respectively the position cannot be guaranteed with a sufficient high accuracy because the thermal expansion of the metals (16.5 m/m·K×10$^{-6}$ and 22.5 m/m·K×10$^{-6}$ respectively) is high. A high thermal expansion may give a risk to unflatness and movements in the plane 24 of the burls 21 if the clamp 20 is changing in temperature. The difference in expansion coefficient of different materials used in the clamp 20 may also result in tensions between the materials and in unflatness of the clamp 20. Another risk may be that the connection between the burls 21 and the support 25 may be too weak which makes that any tension caused by for example the electrode 22 or the dielectric 23 may result in unflatness of the clamp and/or translations of the burls 21 in the plane 24. It may therefore be beneficial to make the support 25 and the burls 21 out of one material. The connection between the two can be made with improved rigidity if its made out one piece, this overcomes any tensions within the clamp 20. The material of the support 25 provided with the burls 21 preferably has a thermal expansion of less than about 10 m/m·K×10$^{-6}$. The material may be for example SiC (Silicon Carbide as for example produced by KYOCERA™ which has a thermal expansion of 4 m/m·K×10$^{-6}$) SiSiC(Siliconized Silicon Carbide as produced by SAINT GOBAIN™, thermal expansion 4 m/m·K×10$^{-6}$) or Si$_3$N$_4$ (Silicon Nitride, thermal expansion 3.3 m/m·K×10$^{-6}$). Objects such as substrates and reticles that may need to be clamped on the electrostatic clamp 2 may be made of silicon and quartz respectively. Silicon has a thermal expansion of 2 to 3 m/m·K×10$^{-6}$ and Quartz has a thermal expansion depending on his manufacturing process of 0.05 to 9 m/m·K×10$^{-6}$. The thermal expansion of the clamp 20 may be chosen such that it is close to the thermal expansion of the objects clamped on the clamp 20 to minimize tension between the object and the electrostatic clamp 20. This results in a better flatness of the object on the clamp 20 and a more stable position of the object on the clamp 2.

The materials mentioned above are also much harder than copper. The (Knoop 100 g) hardness of SiC and SiSiC is 2800 Kg/mm$^2$ corresponding to a Moh's hardness of 9-10 and Si$_3$N$_4$ has a (Knoop 100 g) hardness of 2200 Kg/mm$^2$ corresponding to a Moh's hardness of 9. As described in the above paragraph hardness is important to avoid wear and adhesive forces of the burls 21. Copper has a Moh's hardness of about 3-5 which means it is much softer than the above mentioned Silicon Carbides and Silicon Nitride. Substrates and patterning devices (e.g. reticles) that may need to be clamped on the electrostatic clamp 2 may be made of silicon and quartz respectively. Silicon has a Moh's hardness of between 6 and 7 and quartz has a Moh's hardness of 7 which makes that when copper is used for the burls 21 it is the burl that will wear. If the burls 21 wear the position of the plane 24 may differ and the burls 21 will be sensitive for adhesive forces.

The thermal conductivity of SiC is 120 W/m·K and of Silicon Nitride is 30 W/m·K which is lower than that of cupper which is 394 W/m·K or the 237 W/m·K for aluminum but in most applications this will be enough to get enough heat transport to the temperature control system. The temperature control system may use a water duct 27 within the support 25 of the electrostatic 20 clamp to control the temperature of the clamp 2.

Figure 5:
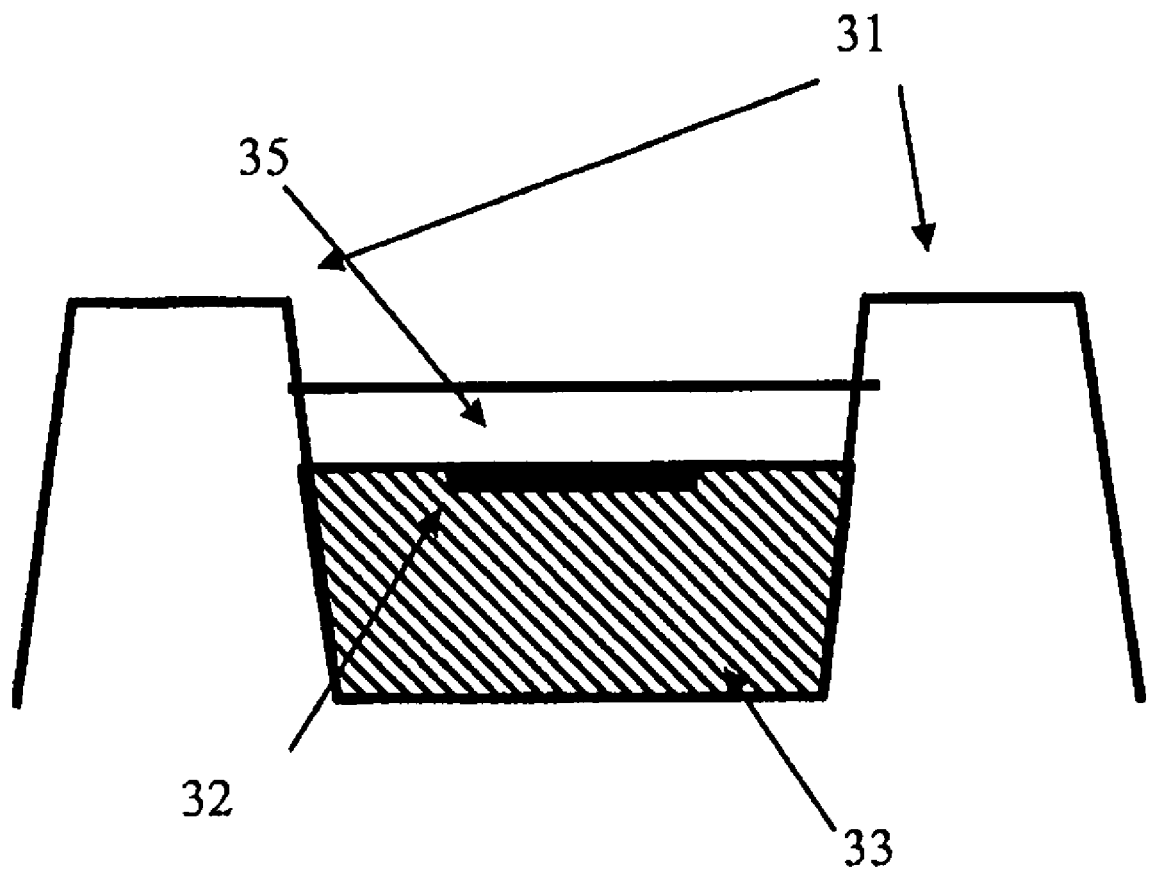
FIG. 5 depicts a partial cross section of the top layer of an electrostatic clamp according to a further embodiment of the invention.

FIG. 5 depicts a partial cross section of the top layer of an electrostatic clamp according to a further embodiment of the invention. In the embodiment shown in FIG. 4, the electrode 32 is surrounded by an insulator and or a dielectric material 35, 33 and is provided in between the burls 31. In the embodiment of FIG. 5 insulator material 33 is provided underneath the electrode and the dielectric material 35 is provided above the electrode 32. The dielectric material 35, 33 may for example be plastics such as PARYLENE® of Para Tech Coating, Inc, KAPTON®, MYLAR® both of DUPONT™ or Liquid Crystal Polymers (LCP) which also work as an insulator. Quartz such as for example, SCHOTT™ sealing glass, SCHOTT™ AF37 or SCHOTT BOROFLOAT® 33 may also be used as a dielectric insulator. Other materials that may be used as an insulator and or dielectric may be Borium-nitride.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. An electrostatic clamp configured to, in use, hold an object in a substantially fixed plane in a lithographic apparatus, the clamp comprising:
a support including a base having an upper surface and a plurality of burls extending from the upper surface of said base, each of said plurality of burls including a top and a bottom portion, the top of the burls determining the plane in which the object is held and the bottom of the burls arranged on the upper surface of the base; and
an electrode provided between two burls and not extending higher than the top portions and not extending lower than the bottom portions of the two burls and surrounded by an insulator,
wherein the support provided with the burls is made out of one piece of a low expansion material.

2. The electrostatic clamp according to claim 1, wherein the support is made from a material having an expansion coefficient of less than about 10 m/m·K×10$^{-6}$.

3. The electrostatic clamp according to claim 2, wherein the support is made from a material having an expansion coefficient of less than about 4 m/m·K×10$^{-6}$.

4. The electrostatic clamp according to claim 1, wherein the electrostatic clamp includes a temperature control system.

5. The electrostatic clamp according to claim 4, wherein the temperature control system comprises a water duct.

6. The electrostatic clamp according to claim 1, wherein the support is made of a non-metal material.

7. The electrostatic clamp according to claim 1, wherein the insulator is a dielectric material.

8. The electrostatic clamp according to claim 7, wherein the dielectric material is PARYLENE®.

9. The electrostatic clamp according to claim 7, wherein the dielectric material is KAPTON®.

10. The electrostatic clamp according to claim 7, wherein the dielectric material is MYLAR®.

11. The electrostatic clamp according to claim 7, wherein the dielectric material is quartz.

12. The electrostatic clamp according to claim 7, wherein the dielectric material is a liquid crystal polymer.

13. The electrostatic clamp according to claim 7, wherein the dielectric material is borium nitride.

14. The electrostatic clamp according to claim 1, wherein the insulator includes two different materials.

15. The electrostatic clamp according to claim 14, wherein a first of the two different materials is arranged above the electrode and a second of the two different materials is arranged below the electrode between the electrode and the upper surface of the base.

16. A method of manufacturing an electrostatic clamp configured to electrostatically clamp an object to an object support in a lithographic apparatus, the method comprising:
providing a layer of material with burls on a base of the object support, the base having an upper surface, each of said burls including a top and a bottom portion, the top of the burls determining the plane in which the object is held and the bottom of the burls arranged on the upper surface of the base; and
placing an electrode surrounded by an insulator and or a dielectric material between two burls and not extending higher than the top portions and not extending lower than the bottom portions of the two burls,
wherein the support provided with the burls is made out of one piece of a low expansion material.

17. A method according to claim 16, further comprising using a sputtering process, chemical vapor deposition process, or a combination thereof to provide the insulator and or dielectric material.

18. A lithographic apparatus comprising:
an object support constructed to support an object in a beam path of a radiation beam;
an electrostatic clamp configured to electrostatically clamp the object against the object support, the clamp comprising
a support including a base having an upper surface and a plurality of burls extending from the upper surface of said base, each of said plurality of burls including a top and a bottom portion, the top of the burls determining a plane in which the object is held and the bottom of the burls arranged on the upper surface of the base; and
an electrode provided between two burls and not extending higher than the top portions and not extending lower than the bottom portions of the two burls and surrounded by an insulator, wherein the support provided with the burls is made out of one piece of low expansion material.

19. The lithographic apparatus according to claim 18, wherein the object is a substrate to be exposed by the radiation beam.

20. The lithographic apparatus according to claim 18, wherein the object is a patterning device configured to pattern the beam of radiation.

21. A lithographic apparatus comprising:
an illumination system configured to condition a beam of radiation;
a pattern support configured to hold a patterning device, the patterning device configured to pattern the beam of radiation to form a patterned beam of radiation;
a substrate support configured to hold a substrate;
a projection system configured to project the patterned beam of radiation onto the substrate; and
an electrostatic clamp configured to electrostatically clamp the patterning device or the substrate on the respective support, the clamp comprising
a table including a base having an upper surface and a plurality of burls extending from the upper surface of said base, each of said plurality of burls including a top and a bottom portion, the top of the burls determining a substantially planar surface on which the patterning device or the substrate is held and the bottom of the burls arranged on the upper surface of the base; and
an electrode encapsulated by an insulator and arranged between two burls and not extending higher than the top portions and not extending lower than the bottom portions of the two burls, wherein the table provided with the burls is made out of one piece of from low expansion material.

* * * * *